Aug. 20, 1968 M. G. KAUFMAN 3,398,374
TIME GATED FILTER
Filed Feb. 26, 1965
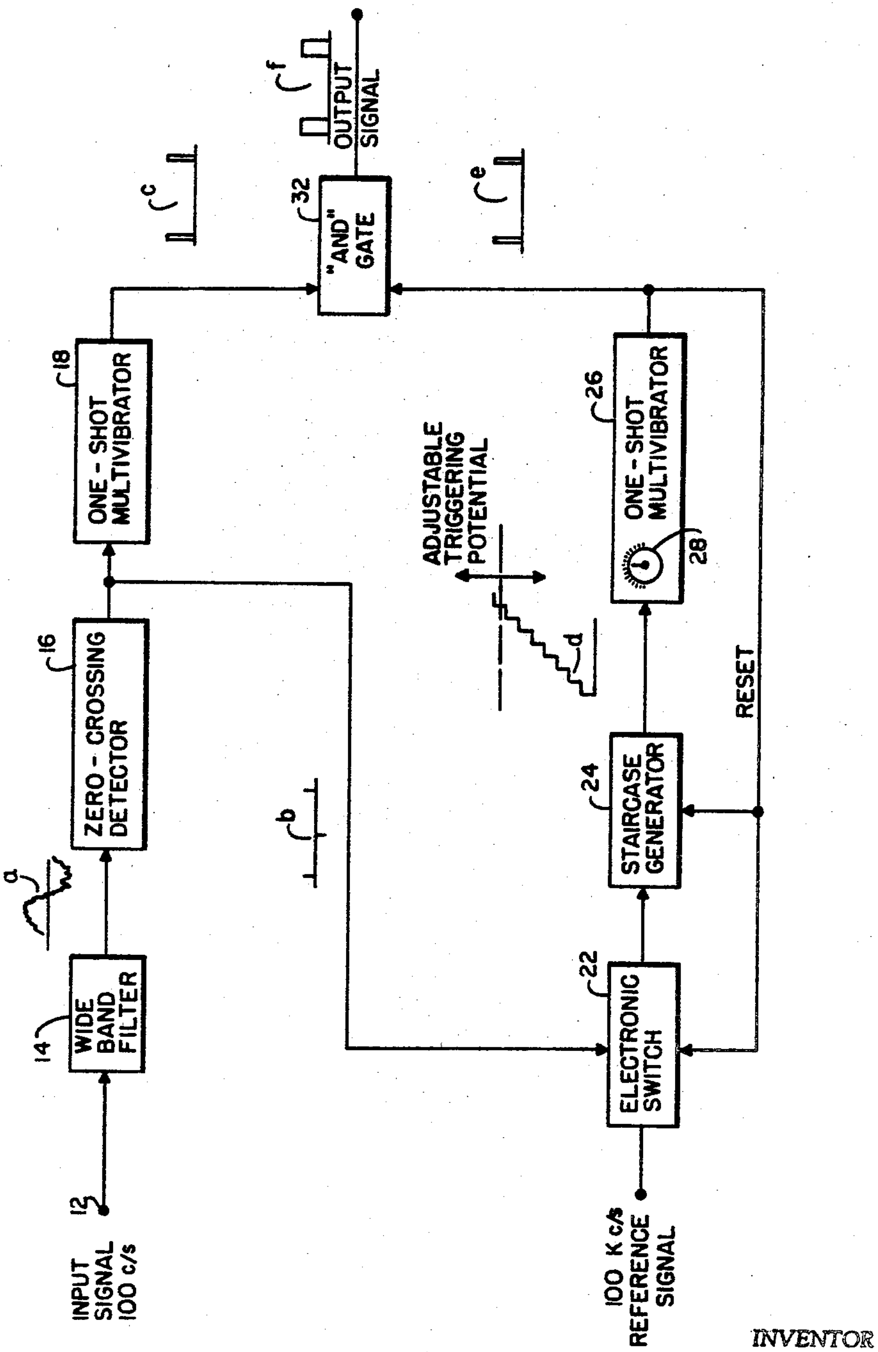
INVENTOR
MAXIME G. KAUFMAN
BY James D. Murray
[signature] ATTORNEYS United States Patent Office 3,398,374

Patented Aug. 20, 1968

3,398,374

TIME GATED FILTER

Maxime G. Kaufman, Camp Springs, Md., assignor to the United States of America as represented by the Secretary of the Navy Filed Feb. 26, 1965, Ser. No. 435,755
3 Claims. (Cl. 328—165)

ABSTRACT OF THE DISCLOSURE

A very narrow band, time-gated filter which introduces a minimum of phase shift. A first channel is utilized to produce pulses of a frequency equal to the frequency of an input signal which may be lost in a large amount of broad band noise or harmonic components; and a second channel generates pulses at predetermined time delays from the pulses generated in the first channel so that the pulses generated in each of the two channels coincides at a coincidence means only when the input signal is of the specific frequency sought to be filtered and a filter output signal is generated which has a frequency equal to the frequency of the input frequency sought to be filtered from the accompanying noise.

The invention described herein may be manufactured and used by or for the Government of the United States of America for governmental purposes without the payment of any royalties thereon or therefor.

The present invention relates to a filter system and more particularly to a very narrow band, time gated filter which introduces a minimum of phase shifts.

Recent advances in the electronic arts, and particularly in such fields as space surveillance, pulse communications, signal processing (recovery) in radar and coded communications, have created an urgent need for extremely high performance devices which are capable of improving the signal to noise ratio by separating differing frequency narrow band signals from broad band noise while introducing a minimum of phase shift. None of the many filters known in the prior art adequately satisfy these stringent requirements.

The general purpose of this invention is to provide an adjustable filter which satisfies the stringent requirements of modern electronic systems. To attain this, the present invention contemplates a unique filter circuit wherein a time gate removes the broad band noise and passes the narrow band signal without appreciable phase shift.

An object of the invention, therefore, is the provision of a time gated filter system.

Another object of the invention is to provide an electrical circuit which will improve the signal to noise ratio of differing frequency narrow band signals.

Yet another object of the present invention is to provide an electrical time gated filter circuit wherein the output signal is both substantially in phase with, and possesses a much better signal to noise ratio than, the input signal.

The exact nature of this invention as well as other objects and advantages thereof will be readily apparent from consideration of the following specification relating to the annexed drawing in which the figure illustrates an embodiment of the invention in block diagram form.

Referring now to the drawing, the circuit of the invention includes an input terminal 12. The input signal, in addition to the desired narrow band signal which is in a predetermined frequency range, may include a large amount of broad band noise and harmonic components of the desired signal. Wide band filter 14 receives the input signal and functions to remove, or greatly attenuate, the harmonics of the desired signal. Filter 14 is designed, in accordance with widely known design practices, to introduce negligible phase shift throughout the predetermined frequency range in which the desired narrow band signal occurs. Typically, the frequency of the narrow band desired signal can be in the frequency range of 95–105 c./s.

The output of filter 14, which is illustrated by curve *a* and includes broad band noise as well as the desired narrow band signal, is next received by a zero-crossing detector 16 which produces a pulse at each instant the filter signal, curve *a*, passes through zero. As shown in curve *b*, the polarity of the pulses is related to the direction of the zero-crossing of the filter signal. Detector 16 may be any one of the many such circuits known in the electronic art.

The positive pulses in the output signal from detector 16 energizes both one-shot or monostable multivibrator 18 and electronic switch 22. Multivibrator18, upon being energized, produces a narrow pulse, as illustrated in curve *c*, which typically can be 5 microseconds long. Electronic switch 22 is connected to a reference source which is extremely frequency stable, typically at 100 kc./s. Upon being energized by the leading edge of a positive pulse from detector 16, the electronic switch 22 is closed and functions to pass the reference signal to staircase generator 24. As shown by curve *d*, which obviously is merely illustrative and not to scale, generator 24 produces an output voltage which increases by incremental steps in response to the reference signal passed through switch 22, that is, the signal *d* increases one incremental step during each cycle of the 100 kc./s. reference signal. One shot or monostable multivibrator 26 is connected to receive the output of generator 24. When the signal *d* reaches a predetermined potential, the value of which can be precisely set and adjusted by control 28, the multivibrator 26 produces a narrow pulse, which typically can be 5 microseconds long, and is illustrated as signal *e*.

The pulse output of multivibrator 26, that is signal *e*, is applied to electronic switch 22 and functions to open this switch, thereby blocking the 100 kc./s. reference signal from generator 24. Signal *e* is also applied for resetting purposes to staircase generator 24 and causes the output of the generator, that is signal *d*, to return to its quiescent state. Both signals *c* and *e* are connected to coincidence or "AND" gate 32 which produces a signal pulse *f* if, and only if, signal pulses *c* and *e* are simultaneously applied. The output pulse signal *f* can, if desired, be utilized to control the generation of whatever particular wave shape is required. For example, pulse signal *f* may be used to synchronize, in a well known manner, the operation of slaved oscillators to produce signals at the desired frequency and in the form of sine waves, square waves, etc.

That is the circuit described and illustrated functions as an adjustable and very narrow band filter with a minimum of phase shift is by now apparent. More specifically, an output signal *f* will occur if, and only if, the frequency of the incoming desired signal is such that the adjustable delay which occurs while components 22, 24 and 26 are converting signal *b* to signal *e* causes the signals *c* and *e* to simultaneously arrive at "AND" gate 32. In other words, the very narrow pass band of the illustrated filter can be tuned over a frequency range by manipulation of control 28 to vary the triggering potential of, or the number of cycles from the reference source required to trigger, the multivibrator 26.

The pass band of the disclosed filter can be narrowed, theoretically to extreme limits, by increasing the frequency of the reference source and narrowing the pulse width of signals *c* and *e*. However, it has been found that as a practical matter the narrowness of the filter pass band is limited by the precision to which the triggering of multivibrator 26 can be controlled.

There has been disclosed an adjustable, narrow band filter which removes broad band noise from a narrow band signal with a minimum introduction of phase shift. Obviously many modifications and variations of the present invention are possible in the light of the above teachings. It is therefore to be understood, that within the scope of the appended claims, the invention may be practiced otherwise than as specifically described.

What is claimed and desired to be secured by Letters Patent of the United States is:

1. A time gated narrow band filter comprising:
- pulse shaping circuit means for receiving the filter input signal and shaping said input signal into a pulsed signal;
- first parallel path means connected to said circuit means for producing a first signal substantially in phase with said pulsed signal;
- second parallel path means connected to said circuit means for producing a second signal delayed an adjustable time from said pulsed signal; and
- coincidence means connected to receive said first and second signals and to produce a filter output signal if, and only if, said first and second signals are in phase;
- wherein said second parallel path means includes an electronic switch connected to receive said pulsed signal and a reference signal of a frequency substantially higher than the frequency of said pulsed signal;
- a staircase generator connected to said electronic switch;
- a monostable multivibrator having an adjustable triggering potential connected to said staircase generator; and
- connecting circuit means for connecting the output of said multivibrator to said coincidence means, electronic switch and staircase generator.

2. A time gated narrow band filter as set forth in claim 1 wherein said first parallel path means includes a zero-crossing detector.

3. A time gated narrow band filter as set forth in claim 1 wherein said coincidence means include an "AND" gate.

References Cited

UNITED STATES PATENTS

| | | | |
|---|---|---|---|
| 2,563,816 | 8/1951 | Butman | 328—186 |
| 2,713,677 | 7/1955 | Scott et al. | 328—165 |
| 2,716,189 | 8/1955 | Ayres | 328—138 |
| 3,028,556 | 4/1962 | Du Vall | 328—140 |
| 3,146,432 | 8/1964 | Johnson | 328—138 |

ARTHUR GAUSS, *Primary Examiner.*

H. DIXON, *Assistant Examiner.*